US006815304B2

(12) United States Patent
Sankin et al.

(10) Patent No.: US 6,815,304 B2
(45) Date of Patent: Nov. 9, 2004

(54) SILICON CARBIDE BIPOLAR JUNCTION TRANSISTOR WITH OVERGROWN BASE REGION

(75) Inventors: Igor Sankin, Starkville, MS (US); Janna B. Dufrene, Starkville, MS (US)

(73) Assignee: SemiSouth Laboratories, LLC, Starkville, MS (US)

( * ) Notice: Subject to any disclaimer, the term of this patent is extended or adjusted under 35 U.S.C. 154(b) by 17 days.

(21) Appl. No.: 10/079,893

(22) Filed: Feb. 22, 2002

(65) Prior Publication Data

US 2003/0160302 A1 Aug. 28, 2003

(51) Int. Cl.[7] ............................................. H01L 21/331
(52) U.S. Cl. ...................................... 438/348; 257/565
(58) Field of Search ................................. 438/335, 336, 438/337, 338, 339, 340, 364, 365, 366, 367, 345, 348

(56) References Cited

U.S. PATENT DOCUMENTS

| | | |
|---|---|---|
| 4,762,806 A | 8/1988 | Suzuki et al. |
| 4,916,083 A | 4/1990 | Monkowski et al. |
| 4,945,394 A | 7/1990 | Palmour et al. |
| 5,323,022 A | 6/1994 | Glass et al. |
| 5,409,859 A | 4/1995 | Glass et al. |
| 5,726,463 A | 3/1998 | Brown et al. |
| 6,218,254 B1 | 4/2001 | Singh et al. |

OTHER PUBLICATIONS

Münch et al., "Silicon Carbide Bipolar Transistor", Solid–State Electronics, vol. 21, 479–480 (1978).
Luo et al., "Demonstration of 4H–SiC Power Bipolar Junction Transistors", Electronic Letters, vol. 36, No. 17, 1496–1497 (2000).
Tang et al., "An Implanted–Emitter 4H–SiC Bipolar Transistor with High Current Gain", IEEE Electron Device Letters, vol. 22, No. 3, 119–120 (2001).
Agarwal et al., "Development of Silicon Carbide High Temperature Bipolar Devices", HITEC, Albuquerque, NM (2000).
Baliga, *Power Semiconductor Devices*, Chapter 5, Bipolar Transistors, PWS Publishing Company, Boston, MA, 231–232 (1996).

*Primary Examiner*—Long Pham
*Assistant Examiner*—Dana Farahani
(74) *Attorney, Agent, or Firm*—Piper Rudnick LLP; Steven B. Kelber

(57) ABSTRACT

Silicon carbide bipolar junction transistors having an overgrown base layer are provided. The bipolar junction transistors can be made with a very thin (e.g., 0.3 $\mu$m or less) base layer while still possessing adequate peripheral base resistance values. Self aligning manufacturing techniques for making the silicon carbide bipolar junction transistors are also provided. Using these techniques, the spacing between emitter and base contacts on the device can be reduced. The silicon carbide bipolar junction transistors can also be provided with edge termination structures such as guard rings to increase the blocking capabilities of the device.

20 Claims, 10 Drawing Sheets

SILICON CARBIDE BIPOLAR JUNCTION TRANSISTOR WITH OVERGROWN BASE REGION

BACKGROUND OF THE INVENTION

1. Field of the Invention

The present invention relates, in general, to a bipolar junction transistor (BJT) formed on silicon carbide and, in particular, to a fully epitaxial vertical SiC bipolar junction transistor with an overgrown base region suitable for use in power microwave applications.

2. Background of the Technology

High power microwave transistors are of great demand in such applications as cellular phone stations, radar systems, etc. Along with silicon lateral MOSFETS, silicon bipolar transistors are now the primary technology used in solid-state radar transmitters. In recent years the advantages of bipolar junction transistors as a power stage in the 0.4 to 4 GHz range have been widely recognized. The newest radar systems are calling for performance requirements that far surpass the capabilities of klystron or tube-type transmitters, but appear ideally suited to solid-state devices.

Today, as the building block power stage unit, a silicon bipolar transistor is the best candidate device for the frequency ranges from UHF through S-band, notwithstanding the advantages in power GaAs and more recent GaN FET technology. Bipolar devices cost-effectively provide for system requirements reliability, ruggedness, electrical performance, packaging, biasing, cooling, availability, and ease of maintenance. Largely due to new developments in processing technology, such as using more shallow emitter diffusions, reduced collector-base time constants, submicron geometries, and more exotic photolithographic processes and etching techniques, creative device packaging, and internal matching techniques, silicon devices are competing effectively up to S-band requirements.

The bipolar junction transistor (BJT) is a well known semiconductor device. A bipolar junction transistor is generally defied as a device formed of a semiconductor material having two p-n junctions in close proximity to one another. In operation, current enters a region (i.e., the emitter) of the device adjacent one of junctions and exits the device from a region (i.e., the collector) of the adjacent the other p-n junction. The collector and emitter have the same conductivity type (i.e., either p or n). A portion of semiconductor material having the opposite conductivity type from the collector and the emitter is positioned between the collector and the emitter. This material is known as the base. The two p-n junctions of the transistor are formed where the collector meets the base and where the base meets the emitter. Because of their respective structures and conductivity types, bipolar junction transistors are generally referred to as either n-p-n or p-n-p transistors.

In operation, when current is injected into or extracted from the base (depending upon whether the transistor is n-p-n or p-n-p), the flow of charge carriers (i.e. electrons or holes) which can move from the collector to the emitter will be effected. Typically, small currents applied to the base can control proportionally large currents passing through the transistor, making the bipolar junction transistor useful as a component of electronic circuits.

Silicon carbide has known advantageous characteristics as a semiconductor material. These characteristics include a wide bandgap, a high thermal conductivity, a high melting point, a high electric field breakdown strength, a low dielectric constant, and a high saturated electron drift velocity. As a result, electronic devices formed from silicon carbide should have the capability of operating at higher temperatures, at higher device densities, at higher speeds, at higher power levels and even under higher levels of radiation than other semiconductor materials. Silicon carbide bipolar transistors, which have excellent blocking capability, small specific on-resistance, and high thermal conductivity, are therefore promising candidates to replace silicon devices, particularly in power transistors for high frequency applications.

Silicon carbide bipolar junction transistors are known. See, for example, v. Münch et al., "Silicon Carbide Bipolar Transistor", Solid State Electronics, Vol.21, pp. 479–480 (1978); Luo et al., "Demonstration of 4H-SiC Power Bipolar Junction Transistors", Electronic Letters, Vol. 36, No. 17 (2000); Tang et al., "An Implanted-Emitter 4H-SiC Bipolar Transistor with High Current Gain", IEEE Electron Device Letters, Volume 22, Issue 3, pp. 119–120 (2001) and U.S. Pat. Nos. 4,762,806, 4,945,394 and 6,218,254. A 4H-SiC bipolar junction transistor, for example, has been reported to demonstrate a blocking voltage of 1.8 kV, on resistance of 10.8 m$\Omega \cdot$cm$^2$, and a temperature stable current gain with a peak value of 20. See Agarwal et al., "Development of Silicon Carbide High Temperature Bipolar Devices", HITEC, Albuquerque, N.M ex. (2000). This SiC transistor also showed a positive temperature coefficient in the on-resistance characteristics, which may facilitate paralleling the device. These properties could confer advantages over silicon bipolar junction transistors, where thermal runaway can be a problem.

At high frequencies, the operating characteristics of silicon carbide bipolar junction transistors are highly dependent on the thickness of the p-base layer. Generally, thinner p-base layers confer better high frequency performance. However, it can be difficult to form base layers having desirable thicknesses for high frequency (e.g., microwave) applications. Further, achieving adequate ohmic contact to a very thin base region while minimizing peripheral base resistance can be difficult. As a solution to this problem, v. Münch et al., supra, proposed thinning an epitaxially grown SiC base layer and forming an overgrown emitter layer thereon.

The lateral dimensions of a bipolar junction transistor can also affect the high frequency performance of the device. It is generally desirable to shrink or scale down the dimensions of the device. Features are typically formed in semiconductor devices using photolithography techniques. Such techniques, however, require numerous process steps and can be costly to implement. Further, the resolutions obtainable using conventional photolithography techniques are limited. Self alignment techniques have also been proposed as an alternative to photolithographic techniques. See, for example, U.S. Pat. No. 6,218,254 (hereinafter the '254 patent). Self alignment techniques are manufacturing techniques wherein device features automatically and inherently align as a result of the manufacturing process. The use of self-alignment techniques can allow for the formation of fine features while simplifying the manufacture of the device. The '254 patent discloses a method of fabrication of SiC bipolar junction transistors having self-aligned ion implanted n-plus emitter regions or ion implanted p-plus regions for base ohmic contacts. The high energies required for ion implantation, however, can result in damage to the device. Further, ion implantation typically requires a high temperature annealing step to activate the implanted impurities. These additional process steps add to both the cost and complexity of the manufacturing process.

There still remains a need, therefore, for improved methods of making SiC bipolar junction transistors having sufficiently thin p-base regions for improved high frequency performance. Such methods would ideally allow for adequate ohmic contact to the base and would provide devices having minimal peripheral base resistance.

SUMMARY OF THE INVENTION

According to a first aspect of the invention, a method of making a SiC bipolar junction transistor is provided. The method includes steps of: providing a collector comprising SiC doped with a donor material, the collector having first and second major surfaces; optionally forming a drift layer on the first major surface of the collector, the drift layer comprising SiC doped with a donor material; forming a first base layer on the first major surface of the collector or on the drift layer, the first base layer comprising SiC doped with an acceptor material; forming an emitter layer on the first base layer, the emitter layer comprising SiC doped with a donor material; etching through the emitter layer and the first base layer to expose the collector or drift layer and to form one or more raised emitter regions having upper surfaces defined by regions of etched emitter and first base layer, the etched regions comprising bottom and sidewall surfaces; forming a second base layer comprising SiC doped with an acceptor material, wherein the second base layer covers the bottom and sidewall surfaces of the etched regions and the upper surfaces of emitter regions; forming emitter contact openings through the second base layer on upper surfaces of the emitter regions to expose emitter material, the emitter contact openings having bottom and sidewall surfaces; forming base contacts on surfaces of the second base material in the etched regions; and forming emitter contacts on surfaces of the emitter material in the emitter contact openings.

According to a second aspect of the invention, a silicon carbide bipolar junction transistor is also provided. The transistor includes a collector having first and second major surfaces. The collector comprises silicon carbide doped with a donor material. A drift layer can be formed on the first major surface of the collector. The drift layer comprises silicon carbide doped with a donor material. A plurality of raised emitter regions are formed on either the drift layer or on the first major surface of the collector. The raised emitter regions are non-coextensive with the drift layer or the collector and are formed on a central portion of the drift layer or collector. The raised emitter regions include an upper emitter layer formed on a lower base layer. The lower base layer is in contact with either the collector or drift layer and the upper emitter layer is substantially coextensive with the lower base layer. The upper emitter layer comprises SiC doped with a donor material and the lower base layer comprises SiC doped with an acceptor material. The transistor also includes a second base layer doped with an acceptor material at a higher doping level than the lower base layer. The second base layer is formed on exposed surfaces of the collector or drift layer and on exposed surfaces of the raised emitter regions. Emitter openings can be formed in the second base layer on upper surfaces of the emitter regions and emitter contacts can be disposed in the emitter openings. Base contacts can be formed on the second base layer. According to a preferred embodiment of the invention, the first base layer of the transistor has a thickness of 0.2 µm or less.

According to a further embodiment of the invention, the silicon carbide bipolar junction transistor further includes a base contact layer formed on and coextensive with the second base layer. Emitter contact openings can be formed in the base contact layer and the underlying second base layer on upper surfaces of the emitter regions such that the emitter contact openings in the second base layer are substantially aligned with the emitter contact openings in the base contact layer. Emitter contacts can be disposed on exposed emitter material in the emitter contact openings.

BRIEF DESCRIPTION OF THE FIGURES

The present invention may be better understood by reference to the accompanying drawings in which.

DETAILED DESCRIPTION OF THE INVENTION

Figure 1:
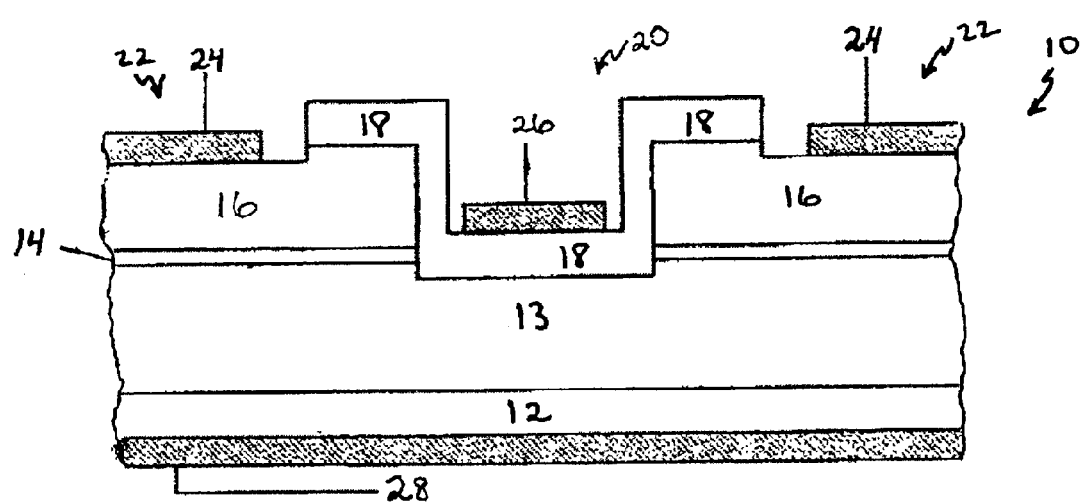
FIG. 1 is a cross-sectional view of a portion of a SiC bipolar junction transistor with an overgrown p+ base region according to a first embodiment of the invention.

According to the invention, an epitaxially grown high-frequency bipolar junction transistor (BJT) in SiC is provided. The device according to the invention comprises a relatively thin (e.g., 3 µm or less) first base region and an overgrown second base region. The overgrown base region provides electrical contact to the first base region of the bipolar junction transistor. According to the invention, emitter contact openings can be formed (e.g., etched) in the overgrown base layer with a self-alignment technique wherein a base contact layer formed on the overgrown base layer is used as a mask to etch the underlying overgrown base layer. Emitter contacts can then be formed in the resulting self-aligned emitter contact openings. A silicon carbide bipolar junction transistor according to the invention can have a thin base region, the thickness of which can depend on the doping level and the target base punch-through voltage of the device.

The cutoff frequency of a transistor may be expressed through the emitter—to collector delay time as follows:

$$f_T = \frac{1}{2\pi\tau_{ec}}$$

wherein $f_T$ is the transition frequency and $\tau_{ec}$ is the emitter-to-collector delay time. The emitter-to-collector time $\tau_{EC}$ is made up of a number of delay components as set forth in the following equation:

$$\tau_{ec} = \tau_e + \tau_t + \tau_d + \tau_c$$

wherein $\tau_e$ is the emitter-base junction capacitance charging time, $\tau_t$ is the base transit time, $\tau_d$ is the transit time through the collector depletion region, and $\tau_c$ is the collector capacitance charging time. At the mode of high level injection, the base layer charging time $\tau_t$ becomes the determining factor of the transistor high frequency performance. This term is proportional to the square of the base width $W_b$ and inversely proportional to the minority carrier diffusion length in the neutral base $D_b$ as set forth in the following equation:

$$\tau_t = \frac{W_b^2}{2D_b}$$

Such dependence of frequency response on base parameters shows the importance of making the base region of SiC bipolar junction transistors as thin as possible, especially when operating at high (e.g., microwave) frequencies.

Because of the limited diffusion of dopants in SiC, the base and emitter regions of a SiC bipolar junction transistor may be either implanted or grown. Ion implantation, however, can result in surface and bulk damage. Ion implantation also requires a special treatment after implantation (e.g., a post implant anneal) to activate the implanted impurity. Further, even after a high temperature post-implant anneal, a large percentage of certain implanted impurities (e.g. boron and aluminum which are typically used for doping SiC) can remain electrically inactive occupying interstitial sites. This phenomenon can result in a reduction in the electron lifetime of the implanted base. Bulk damage in the emitter region resulting from ion implantation can also increase the recombination rate in the emitter, which can lead to an increase of the base current.

Doping in-situ during epitaxial growth of the base and emitter regions can be used to avoid certain of the aforementioned problems associated with ion implantation. For example, very thin (i.e., 0.1 μm) base layers can be formed using in-situ doping during epitaxial growth. However, making the epitaxial base as thin as possible, which is very desirable in high frequency applications, can give rise to other problems including making ohmic contact to such a base and minimizing the peripheral resistance of the base. Thinning the base layer after formation (e.g., by etching) is one means that has been employed to achieve a desired base layer thickness. See, for example, v. München et al., supra. However, it is very difficult to avoid over-etching a thin (e.g., 0.1 μm thick) base layer. Further, the sheet resistance of a thin base region may be too high to achieve acceptable high frequency performance.

The present inventors have discovered that improved bipolar junction transistor device performance can be achieved by using a heavily doped overgrown base region. The overgrown base region can be used to provide a larger electrical contact surface for the thin base layer. The overgrown base region according to the invention can also reduce the peripheral base resistance of the bipolar junction transistor. By using a high doping level in the overgrown base layer, minority carrier injection from the emitter into the overgrown base layer can be suppressed since the potential barrier between the emitter and the overgrown p-plus layer is higher than that between the emitter and the p-type base region.

FIG. 1 shows a cross sectional view of a portion of a SiC bipolar junction transistor according to a first embodiment of the invention. Transistor 10 comprises a collector 12, a drift layer 13, a first base layer 14, and emitter regions 16. Emitter regions 16 are shown spaced from one another by a trench 20.

The structure shown in FIG. 1 can be made by forming on a first major surface of collector 12, in succession, drift layer 13, first base layer 14 and a layer of emitter material. The collector can be a doped SiC single crystal. Doped SiC single crystals can be obtained from commercial sources such as Cree, Inc. of Durham, N.C.

The drift, first base and emitter layers can be formed by epitaxial growth wherein the dopant material is incorporated into the SiC layer during growth. An etched region (e.g. a trench) can then be formed by etching through the emitter layer. Since the first base layer is very thin (e.g., as thin as 0.1 μm or less), first base layer 14 will also be etched through during etching of the emitter layer to expose underlying drift layer 13. An overgrown base layer 18 can then be formed on bottom and sidewall surfaces of trench 20 as well as on upper surfaces of emitter regions. Emitter contact openings 22 can then be provided in overgrown base region on upper surfaces of emitter regions 16. Emitter contacts 24 and base contact 26 can then be disposed in emitter contact openings and trenches respectively. A collector contact 28 is also shown disposed on the remaining exposed major surface of collector 12. The method of making the SiC bipolar junction transistor is described in detail with reference to FIGS. 6 and 7 below.

Although a trench 20 is shown in FIG. 1 separating two raised emitter regions 16, a device having a single raised emitter region can also be made according to the invention. In the manufacture of such a device, there would be no need to form trenches. Rather, emitter material could be removed from regions surrounding the raised emitter region to form the single emitter.

According to a preferred embodiment of the invention, the collector is heavily doped with a donor material. The preferred thickness of the collector is between 300 and 400 μm. Collectors of other thicknesses, however, can be used depending on the desired characteristics of the transistor. Although a drift layer is shown in FIG. 1, it is not necessary for a bipolar junction transistor according to the invention to include a drift layer. A drift layer is typically used to improve operating characteristics of the device in certain applications (e.g., in power applications). If a drift layer is used, the drift layer will have a doping level less than that of the collector layer. The drift layer thickness can also be varied according to the invention to achieve desirable operating characteristics. Drift layer thickness can be chosen, for example, based on the operating voltage and operating frequency of the device. For high voltage applications, the drift layer preferably has a thickness of 4 μm or greater. For high frequency applications (e.g., 2 Ghz or greater), the drift layer preferably has a thickness of 4 μm or less.

According to a preferred embodiment of the invention, the collector layer is heavily doped with a donor material and the drift layer is lightly or moderately doped with a donor material. Suitable donor materials include nitrogen and phosphorous. Nitrogen is a preferred donor material according to the invention. The above materials are merely exemplary, however, and any other donor material suitable for silicon carbide can also be used.

The emitter layer is also preferably heavily doped with a donor material. The thickness of the emitter layer can also be varied to provide desirable device operating characteristics. According to a preferred embodiment of the invention, the emitter layer has a thickness of 0.5 to 1 µm.

The first base layer according to the invention is preferably moderately or lightly doped with an acceptor material. The doping level of the first base layer can be varied depending upon the operating conditions (e.g., voltage and frequency) of the device. Generally, the doping level of the first base layer will be sufficiently high to prevent voltage punch-through during operation of the device. The punch through voltage of the device, however, is also dependent upon the thickness as well as the doping level of the base layer. Generally, higher doping levels are required for thinner base layers to prevent voltage punch through. For example, for a 0.1 µm thick base layer and a 4 µm thick drift region with a donor concentration of $5 \times 10^{16}$ atoms·cm$^{-3}$, the base p-type doping level can be in the range of $2 \times 10^{18}$ atoms·cm$^{-3}$ to $3 \times 10^{18}$ atoms·cm$^{-3}$. The doping level of the base layer will preferably be in the range of $1 \times 10^{18}$ atoms·cm$^{-3}$ to $2 \times 10^{18}$ atoms·cm$^{-3}$. According to a preferred embodiment of the invention, the first base layer will have a thickness of 0.1 to 0.3 µm.

Suitable acceptor materials for doping silicon carbide include boron and aluminum. Aluminum is a preferred acceptor material. The above materials are merely exemplary, however, and any acceptor material which can be doped into silicon carbide can be used according to the invention.

The overgrown base layer according to the invention will have a higher doping level than the first base layer. The overgrown base layer is preferably heavily doped with an acceptor material. The doping level and thickness of the overgrown base layer can be varied depending upon the requirements and operating characteristics of the device.

The doping levels and thicknesses of the various layers of the bipolar junction transistor according to the invention can be varied to produce a device having desired characteristics for a particular application. Unless otherwise indicated, heavily doped in the context of the invention corresponds to dopant concentrations of $10^{18}$ atoms·cm$^{-3}$ or greater, lightly doped corresponds to dopant concentrations of $5 \times 10^{16}$ atoms·cm$^{-3}$ or less and moderately doped corresponds to dopant concentrations of between $5 \times 10^{16}$ atoms·cm$^{-3}$ and $10^{18}$ atoms·cm$^{-3}$.

The bipolar junction transistors according to the invention can be made without expensive ion implantation and post-implant anneal steps. Moreover, the use of a heavily doped epitaxial layer to form the overgrown base region allows fabrication at the same time of an edge termination structure in the overgrown base layer. The edge termination structure can be used to increase the blocking capabilities of the device. One example of an edge termination structure are the epitaxial guard rings shown depicted in FIG. 2.

Figure 2:
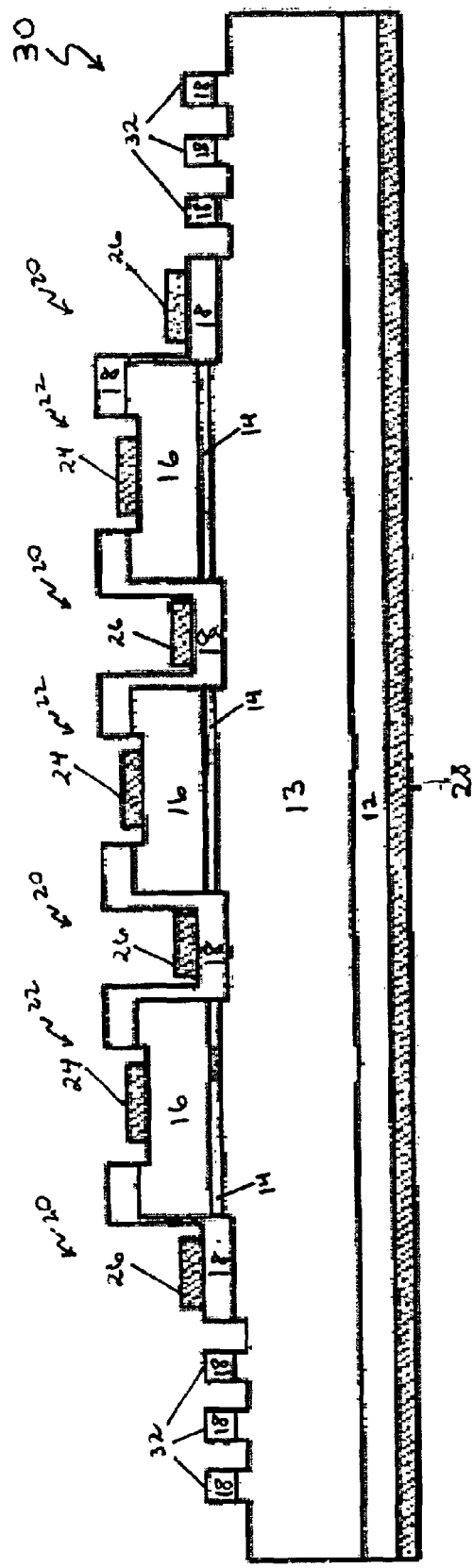
FIG. 2 is a cross-sectional view of a multi-fingered SiC bipolar junction transistor having p+ overgrown base regions and guard rings.

FIG. 2 shows a cross-section of a multi-finger SiC bipolar junction transistor according to the invention. The designation "multi-finger" refers to the configuration of the base and emitter contacts of the device. A multi-fingered device comprises a plurality of elongate emitter contacts interdigitated with a plurality of elongate base contacts. Multifingered arrangements are used to increase the peripheral length of the emitter region and to thereby improve the current carrying capability of the device. See, for example, Baliga, *Power Semiconductor Devices*, pp. 231–232 (1996). Typically, in multi-fingered arrangements, base regions are located outside the outermost emitter regions to maximize the peripheral length of the emitter.

As shown in FIG. 2, bipolar junction transistor 30 comprises three raised emitter regions 16 (e.g., fingers) separated and defined by trenches 20. Trenches 20 can be used as openings for base contacts as described below. Emitter contact openings 22 are shown formed in overgrown base layer 18 on the upper surface of raised emitter regions 16. Emitter contacts 24 and base contacts 26 are also shown formed in emitter contact openings 22 and trenches 20, respectively.

Guard rings 32 are also shown formed in the overgrown base layer in a peripheral region of the device. Guard rings 32, which are etched in overgrown base layer 18, can be formed simultaneously with emitter contact openings 22. As described below, guard rings 32 can be used to improve the blocking capabilities of the bipolar junction transistor. Guard rings for SiC BJTs are also described in related U.S. application Ser. No. 10/079,892, filed on even date herewith). Although guard rings are shown, other known edge termination structures can also be used.

The use of guard rings or other edge termination structures is optional. For example, in some applications (e.g., at high frequencies) a BJT may have a relatively low blocking voltage (e.g., ≈200 V). Under these conditions, edge terminations are not necessary because the blocking voltage will be limited not by avalanche breakdown near the edge of the device but by the base punch-through voltage of the device.

As set forth above, the lateral dimensions (i.e., scale) of the transistor can also affect high-frequency performance. According to the invention, a self-aligned fabrication process can be used to form emitter contact openings and guard rings in the overgrown base layer. Self alignment techniques are manufacturing techniques through which device features automatically and inherently align as a result of the manufacturing process. Self alignment manufacturing techniques have been used to produce silicon carbide MOSFETs and bipolar junction transistors. See, for example, U.S. Pat. Nos. 5,726,463 and 6,218,254.

A self-aligned process according to the invention comprises using the base ohmic contact material (e.g., metal) as an etch mask for fabrication of the emitter contact openings in the underlying overgrown base layer. In this manner, the openings etched in the overgrown base layer will be aligned with the openings formed in the base ohmic contact layer. A device made using this technique is illustrated in FIG. 3.

Figure 3:
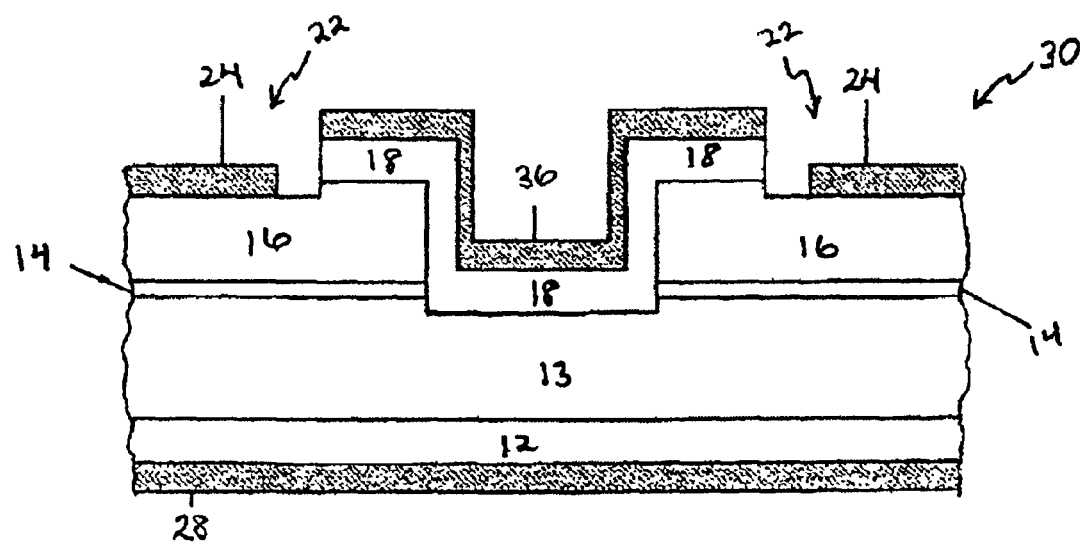
FIG. 3 is a cross sectional view of a portion of a SiC bipolar junction transistor with an overgrown p+ base region wherein the base contact layer is used as a mask for etching emitter contact openings in the underlying p+overgrown base layer according to a second embodiment of the invention.

FIG. 3 shows the cross section of a portion of a silicon carbide bipolar junction transistor according to a second embodiment of the invention wherein a base contact layer 36 is formed on overgrown base layer 18. As can be seen from FIG. 3, base contact layer 36 is formed on bottom and sidewall surfaces of trench 20 as well as on upper surfaces of emitter regions. The base contact layer 36 is typically a metal (e.g., titanium) layer. The base contact layer 36 can be applied by any metallization technique known in the art. According to a preferred embodiment of the invention, base contact layer is applied by sputtering.

After forming base contact layer 36, emitter contact openings 22 are provided in both base contact layer 36 and overgrown base layer 18 on the upper surfaces of emitter regions 16. Emitter contact openings 22 can be formed by first forming openings in base contact layer 36 on the upper surfaces of base contact regions 16 to expose the underlying overgrown base layer 18. The base contact layer 36 having emitter contact openings formed therein can then be used as a mask to form openings in overgrown base layer 18. This process is described in detail below with reference to FIG. 7. Emitter contact openings 22 can be formed in base contact layer 36 by any conventional technique including an etching process (e.g., dry or wet etch) or by a lift-off technique. The portion of the overgrown base contact layer 36 remaining after formation of emitter contact openings 22 can then be used as a base contact for the bipolar junction transistor. After formation of emitter contact openings 22, emitter contacts 24 can be disposed in emitter contact openings 22 in contact with emitter material from raised emitter regions 16.

As set forth above, the base contact layer can be deposited on the overgrown base layer and etched to form openings for the emitter contacts. The etched base contact layer can then be used as an etch mask for making openings in the overgrown base layer. As can be seen in FIG. 3, by using this technique the openings for the emitter contacts in the overgrown base layer are self-aligned with emitter contact openings formed in the overlying base contact layer.

Figure 4:
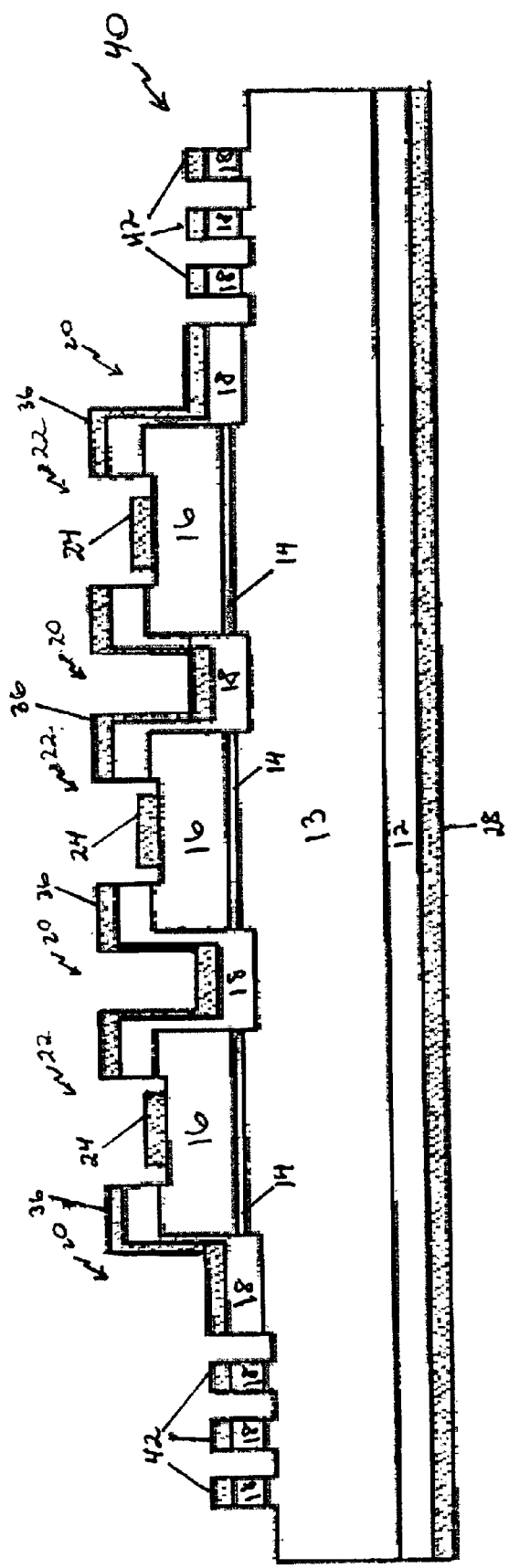
FIG. 4 is a cross-sectional view of a multi-fingered SiC bipolar junction transistor having overgrown p+ base regions and an overgrown base contact layer wherein emitter contact openings and guard rings have been formed by etching the overgrown base layer using the base contact layer as a mask.

FIG. 4 shows a cross-section of a multi-finger SiC bipolar junction transistor according to the invention. As shown in FIG. 4, bipolar junction transistor 40 comprises three raised emitter regions 16 separated and defined by trenches 20. Emitter contact openings 22 are shown formed on the upper surface of emitter regions 16 in overgrown base contact layer 36 and in underlying overgrown base layer 18. Emitter contacts 24 are also shown formed in emitter contact openings 22. Guard rings 42 are shown formed at the edge of transistor 40.

According to an embodiment of the invention, guard rings 42, which are formed in overgrown base contact layer 36 and in underlying overgrown base layer 18, can be formed simultaneously with emitter contact openings 22. In particular, both emitter contact openings 22 and guard rings 42 can be etched or otherwise formed in overgrown base contact layer 36 in a first step and the base contact layer can then be used as a mask to form openings in the underlying overgrown base contact layer 18.

After formation of the emitter contact openings, emitter and/or base contacts can be deposited in contact openings (e.g., emitter contact openings or trenches). The emitter contacts can be deposited in the openings using a conventional lithography process to space the edges of the contacts from the side-walls of the openings.

Using the self-alignment method according to the invention allows for the manufacture of bipolar junction transistors wherein the distance between each emitter contact and adjacent base contacts can be made very small. For example, when the contacts are formed in the contact openings by a photolithography technique, spacings of the emitter contacts from the sidewalls of the emitter contact openings (and thus from the edges of the base contacts) can be obtained down to the limits of conventional photolithography (e.g., 0.18 μm or less). When the base contact layer is overgrown and used as an etch mask (as depicted in FIGS. 3 and 4), the horizontal spacing between the edges of the base and emitter contacts will also be equal to this spacing since the openings in the base contact layer and the underlying overgrown base layer are self-aligned. By reducing spacing between the base and emitter contacts, it is possible to reduce the transistor dimensions and to thereby improve the high-frequency performance of the device.

When the base contact layer is not overgrown on the emitter regions and used as an etch mask for the emitter contact openings, base contacts can be applied to the bottom surfaces of the trenches. The base contacts can also be spaced from the trench sidewalls using a conventional photolithography process. Base contacts formed in trenches are shown, for example, in FIGS. 1 and 2. As can be seen in FIGS. 1 and 2, the base contacts are spaced from the side walls of the trenches.

Formation of base and emitter contacts can be achieved, for example, by forming an insulating layer (e.g., $SiO_2$) on the surface of the device and forming openings (e.g., by etching) in the insulating layer at desired locations. The openings can be located using a photolithography technique.

A number of metals and metal composites are appropriate for use as base, collector and emitter contacts according to the invention. For example, nickel or nickel-titanium combinations are appropriate ohmic contacts to silicon carbide doped with donor materials while aluminum or aluminum-titanium combinations are useful ohmic contacts to silicon carbide doped with acceptor materials. According to a preferred embodiment of the invention, nickel is used as both an emitter and collector contact material and titanium is used as a base contact material. Suitable ohmic contact materials and structures are also disclosed in U.S. Pat. Nos. 5,323,022 and 5,409,859.

The improved spacing achieved using the self-alignment method of the present invention can reduce base resistance and base collector capacitance of the device, and can thereby enable the production of devices which operate at higher frequencies. By reducing the spacing between base and emitter contacts, the specific on-resistance of the device may also be reduced.

Another self-aligned process according to the invention comprises using the base ohmic contact material can as an etch mask for fabrication of edge termination structures (e.g., guard rings) surrounding the bipolar junction transistor. These guard rings can be formed simultaneously with the formation of the emitter contact openings. The epitaxial guard rings formed using the bulk deposited base contact layer as an etch mask therefore comprise a conductive (e.g., metal) top layer overlying an overgrown base material layer. This conductive layer can help to keep the entire ring at the same potential and thereby improve the overall blocking capability of the edge termination structure.

As set forth above, FIG. 4 shows a multifinger SiC bipolar junction transistor with guard rings wherein the base metal layer was used as the etch mask to form both the emitter contact openings and the guard rings. As can be seen from FIG. 4, each of the three guard rings shown has a conductive top layer formed by forming openings in the base contact layer and the underlying overgrown base layer. Although three guard rings are shown, any number of guard rings may be employed according to the invention to achieve desired blocking capabilities for the device. Further, the spacing, width and thickness of the guard rings can also be varied according to the invention to achieve the desired edge termination effects.

The number of base and emitter contact "fingers" or elongate regions can also be varied according to the invention. Generally, the current carrying capability of a transistor is proportional to the peripheral length of the emitter regions. Therefore, use of a finger geometry wherein emitter contacts are interdigitated with base contacts allows the emitter periphery and, as a result, the current carrying capacity of the transistor to be maximized. Any number of emitter fingers can be used according to the invention to achieve the desired current carrying capacity for the device.

A 4H-SiC bipolar junction transistor having the structure shown in FIG. 1 was simulated using "ATLAS" device simulation software from Silvaco, International of Santa Clara, Calif. to determine the base punch-through voltage. The designation "4H" refers to the crystal structure or polytype of the silicon carbide. Silicon carbide crystallizes in over 150 different polytypes, or crystal structures, of which the most common are designated 3C, 4H and 6H. The designation "C" stands for "cubic" and the designation "H" stands for "hexagonal." Currently, the 6H polytype is the most thoroughly characterized. The 4H polytype is more attractive for power devices, however, because of its higher electron mobility.

Figure 5B:
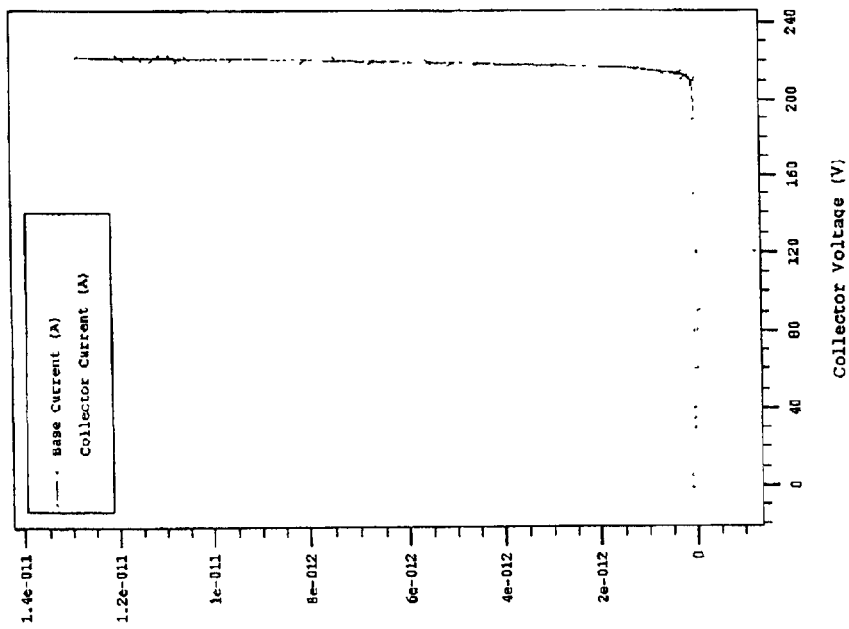
FIG. 5B shows the simulated breakdown characteristics of the 4H-SiC bipolar junction transistor simulated in the depiction of FIG 5A.
Figure 5A:
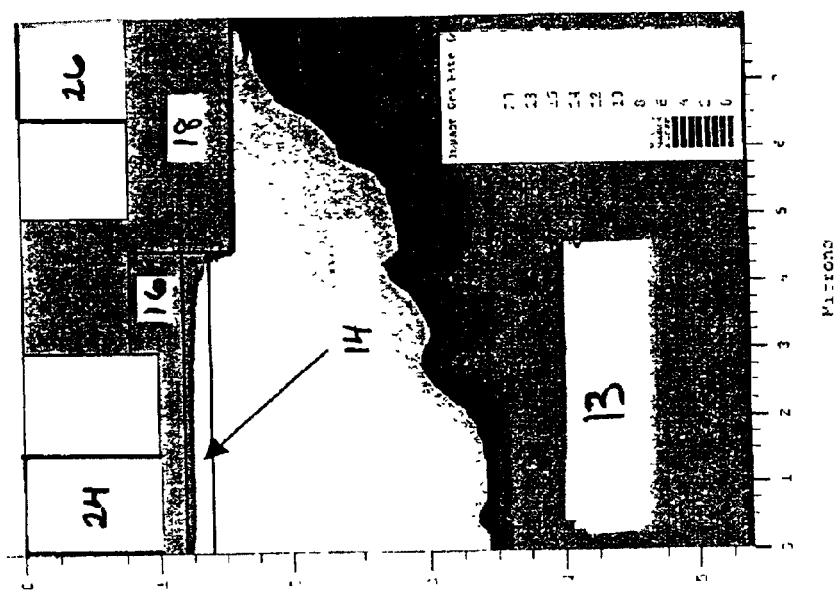
FIG. 5A is a depiction of the simulation of the blocking capabilities of a 4H-SiC bipolar junction transistor having an overgrown p+ layer as set forth in FIG. 1.

The results of the simulation for the 4H-SiC bipolar junction transistor are shown in FIG. 5A. The bipolar junction transistor simulated in FIG. 5A had a first base layer 14 having a thickness of 0.2 $\mu$m and a doping level of $5\times10^{17}$ atoms·cm$^{-3}$. The bipolar junction transistor also had a drift layer 13 having a thickness of 4 $\mu$m and a doping level of $3\times10^{16}$ cm$^{-3}$. An emitter contact 24 is shown in contact with raised emitter region 16 and a base contact 26 is shown in contact with overgrown base layer 18. Distance (in $\mu$m) from a centerline through the raised emitter region is shown on the x-axis and distance (in $\mu$m) from the top of the overgrown base regions is shown on the y-axis. The shading in FIG. 5A indicates the impact generation rate in the device. Impact generation rate is given in units of s$^{-1}$·cm$^{-3}$.

For the simulation shown in FIG. 5A, edge effects were ignored. In actual use, however, edge field crowding may degrade blocking capabilities significantly. As discussed in more detail below, an edge termination structure (e.g., guard rings) can be used to increase the blocking capability of the transistor. As described above, examples of SiC bipolar junction transistor devices with edge termination structures comprising guard rings are shown in FIGS. 2 and 4.

FIG. 5B is a graph showing the simulated breakdown characteristics of the 4H-SiC bipolar junction transistor which was simulated in FIG. 5A. In FIG. 5B, both the base current (x) and the collector current ($\diamond$) are shown as a function of voltage applied to the collector. As can be seen from FIG. 5B, both the base and collector current spike at a collector voltage of approximately 220 volts indicating that the breakdown of the device occurs at this voltage.

Figure 6A:
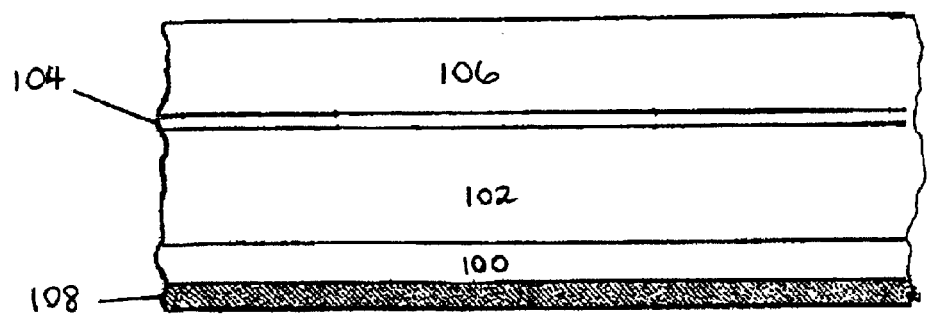
FIGS. 6A–6G show steps involved in the manufacture of a bipolar junction transistor according to a first embodiment of the invention.

FIGS. 6A–6G illustrate steps involved in malting a SiC bipolar junction transistor according to a first embodiment of the invention. In FIG. 6A, a drift layer 102 is shown disposed on a first major surface of collector layer 100. A collector contact layer 108 is shown disposed on the remaining exposed major surface of collector 100.

According to a preferred embodiment of the invention, the drift layer is an SiC layer lightly doped with a donor material (e.g., n minus doped) and the collector is SiC heavily doped with a donor material (e.g. n plus doped). The doping of the SiC with the dopant (e.g., donor or acceptor) is preferably performed in-situ during epitaxial growth of the SiC layers. The SiC layers can be formed by any epitaxial growth method known in the art, including CVD, molecular beam and sublimation epitaxy. According to preferred embodiment of the invention, the doped SiC layers according to the invention are formed by doping in-situ during epitaxial growth wherein dopant atoms are incorporated into the silicon carbide during growth.

In FIG. 6A, a first base layer 104 is shown disposed on drift layer 102 and an emitter layer 106 is shown disposed on first base layer 104. According to a preferred embodiment of the invention, first base layer 104 is moderately doped with an acceptor material and emitter layer 106 is heavily doped with a donor material.

Figure 6B:
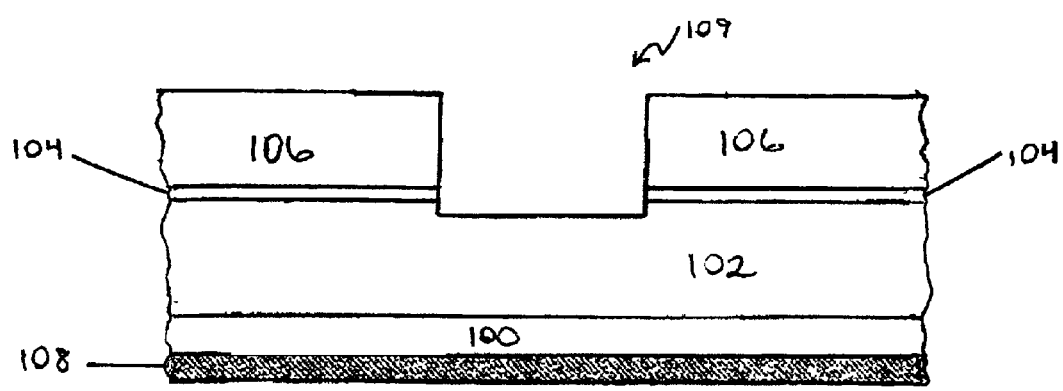

FIG. 6B shows the cross section of FIG. 6A after a first etching step according to the invention. As can be seen from FIG. 6B, a trench 109 is shown etched through emitter layer 106 and first base layer 104. Material from drift layer 102 is shown exposed on the bottom of trench 109. According to a preferred embodiment of the invention, a series of spaced apart trenches are etched parallel to one another in the substrate forming an interdigitated structure of raised emitter areas and trenches (e.g., multi-fingered device). As can be seen in FIG. 6A, the raised emitter regions comprise material from emitter layer 106 and first base layer 104.

Figure 6C:
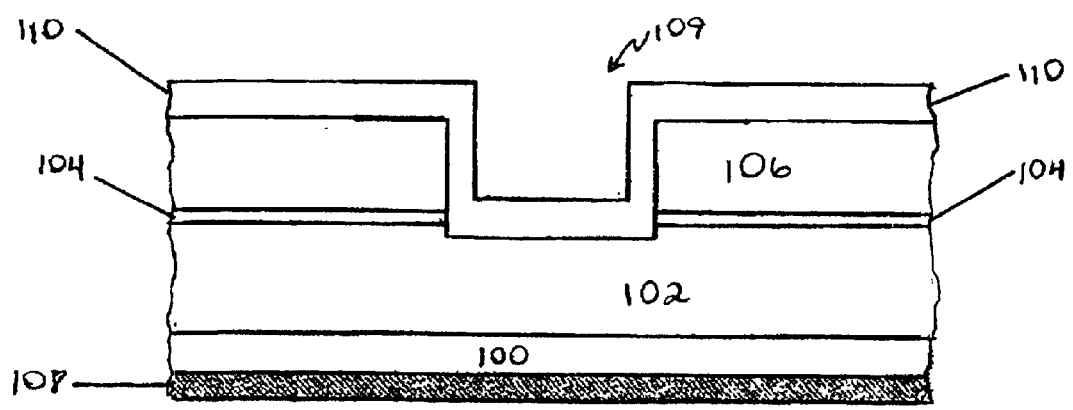

FIG. 6C shows a second base layer 110 formed on the exposed surfaces of the structure depicted in FIG. 6B. Second base layer 110 is preferably a heavily p-doped SiC layer. As can be seen from FIG. 6C, second base layer 110 forms a layer on both the bottom (i.e., horizontal) and sidewall (i.e., vertical) surfaces of the trenches and on the upper (i.e., horizontal) surface of the raised emitter regions.

Figure 6D:
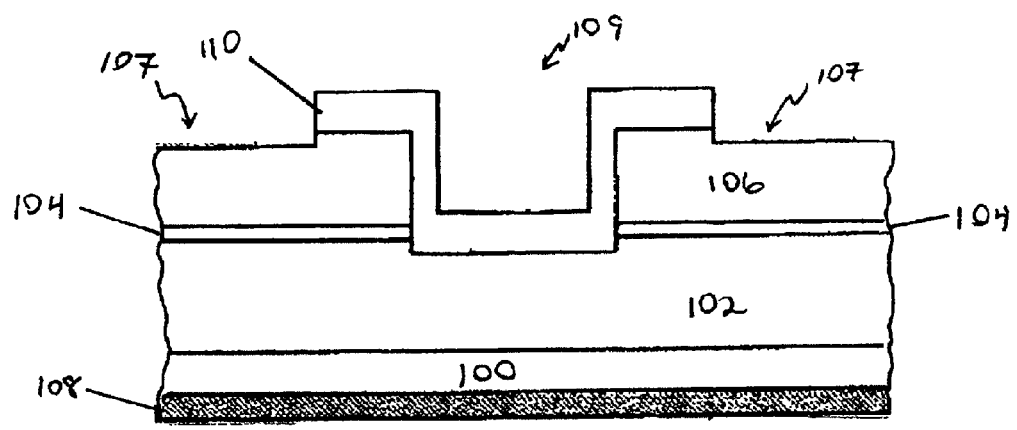

FIG. 6D shows a second etch step in which emitter contact openings 107 are formed in the overgrown base layer on the upper surfaces of emitter mesas exposing material from underlying emitter layer 106.

Figure 6E:
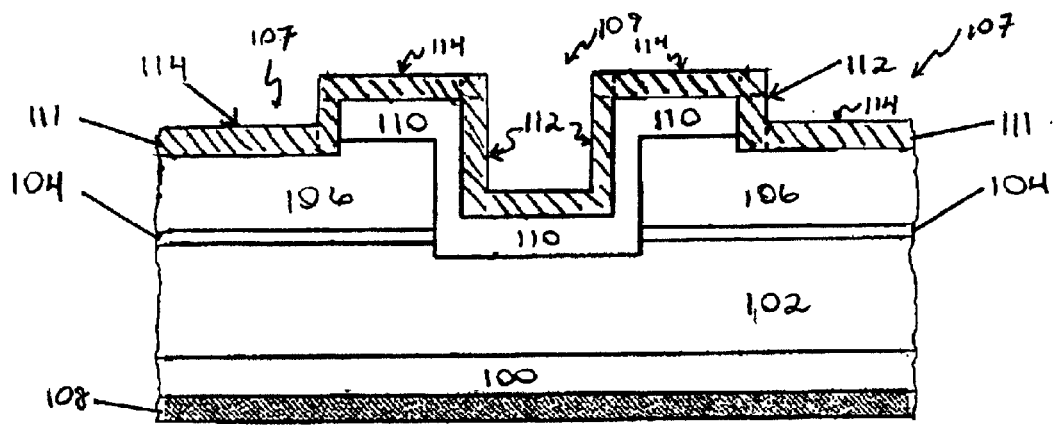

FIG. 6E shows a first step in a method of forming base and emitter contacts according to the invention. In FIG. 6E, an insulating layer 111 is formed on the exposed surfaces of the etched substrate of FIG. 6D. Insulating layer 111 is preferably a silicon dioxide layer. The insulating layer can be formed by any known deposition process (e.g., CVD or PECVD). As shown in FIG. 6E, insulating layer 111 comprises horizontal portions 114 formed on bottom surfaces of trench 109 and emitter openings 107 and vertical portions 112 formed on the sidewalls of trench 109 and emitter openings 107.

Figure 6F:
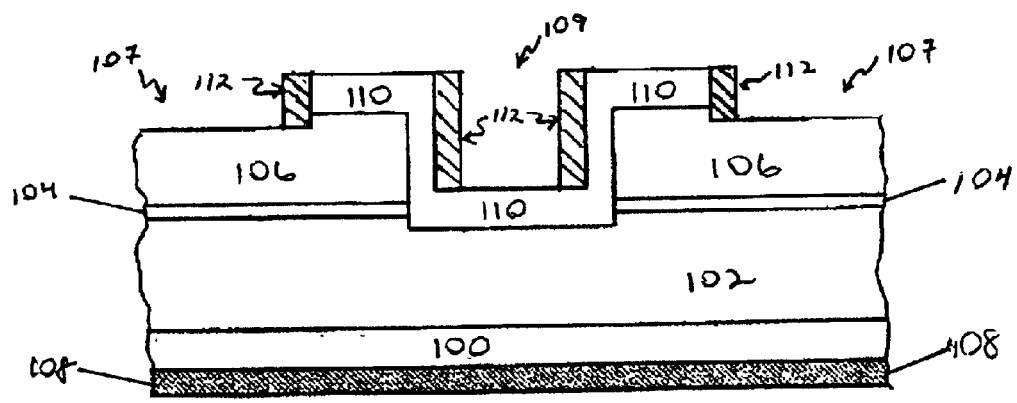

FIG. 6F shows a second step in a method of forming base and emitter contacts. As shown in FIG. 6F, an etching process has been used to remove the insulating layer 111 from emitter regions 106 and overgrown base layer 110 to form openings for base and emitter contacts. The insulating layer 111 can be selectively removed from these regions using a photolithography process. After the etching step, insulating layer 111 remains on the side walls of emitter contact openings 107 and trench 109.

Figure 6G:
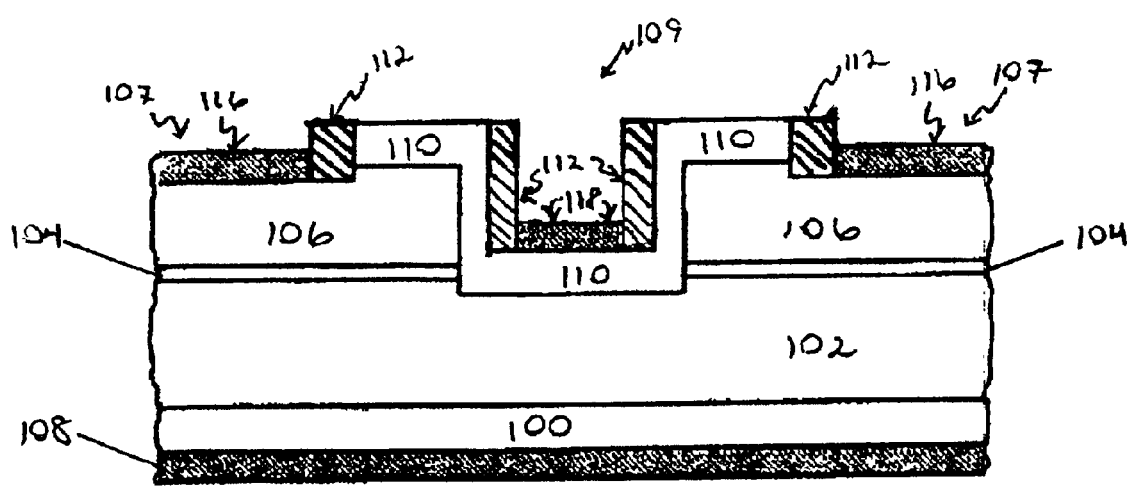

FIG. 6G shows a second step in a method of forming self-aligned base and emitter contacts. As shown in FIG. 6G, base contact 118 and emitter contacts 116 have been deposited on exposed surfaces of overgrown base 110 in trench 109 and on exposed surfaces of emitter layer 106 in emitter contact openings 107 respectively. As can be seen in FIG. 6G, the base and emitter contacts are spaced from the sidewalls of trench 109 and emitter contact openings 107 by insulating material 112 from insulating layer 111.

Figure 7A:
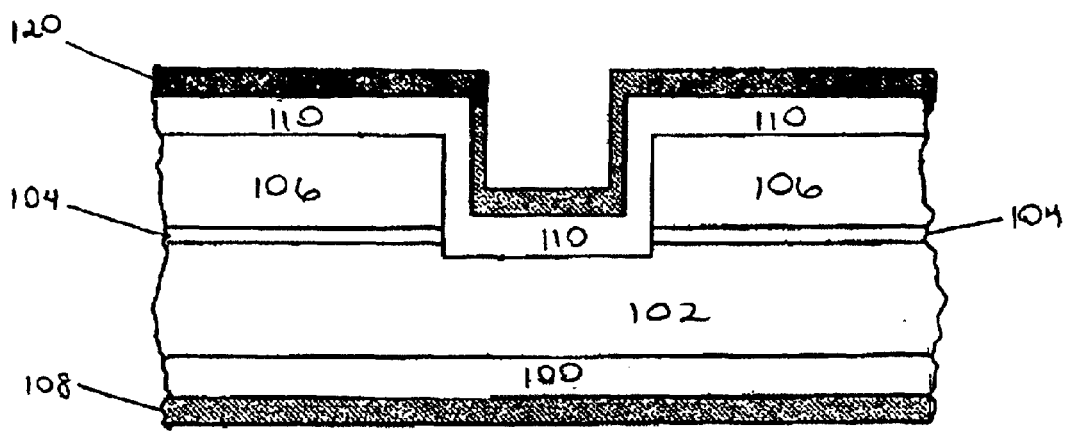
FIGS. 7A–7F show steps involved in manufacture of a bipolar junction transistor according to a second embodiment of the invention.

FIGS. 7A–7F illustrate a method of forming a SiC bipolar junction transistor according to a second embodiment of the invention. FIG. 7A shows a base contact layer 120 disposed on the overgrown base layer of the substrate of FIG. 6C. Base contact layer 120 can be deposited on overgrown base layer 110 by any method (e.g., chemical vapor deposition, sputtering, etc.) known in the art. Base contact layer is preferably a metal layer.

Figure 7B:
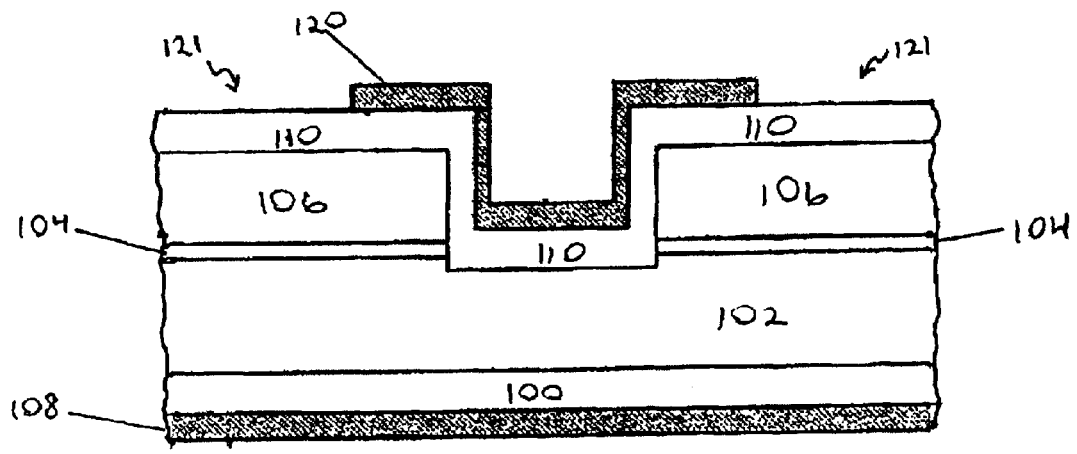

FIG. 7B shows emitter contact openings 121 formed in base contact layer 120 on the upper surfaces of raised emitter regions 106. The emitter contact openings can be formed in base contact layer by any known metal patterning technique including metal etching and metal lift-off techniques.

Figure 7C:
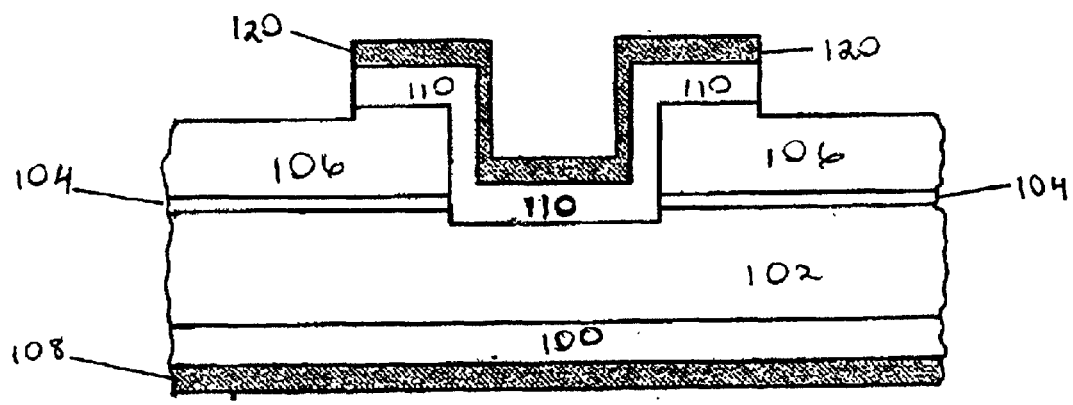

FIG. 7C shows emitter contact openings 121 etched in overgrown base layer 110 on the upper surfaces of raised emitter regions 106. The etching step can be performed using base contact layer 120 with emitter contact openings 121 formed therein as a mask in the etching of overgrown base layer 110. In this manner, emitter contact openings in overgrown base layer 110 are self-aligned with emitter contact openings 121 in base contact layer 120.

Figure 7D:
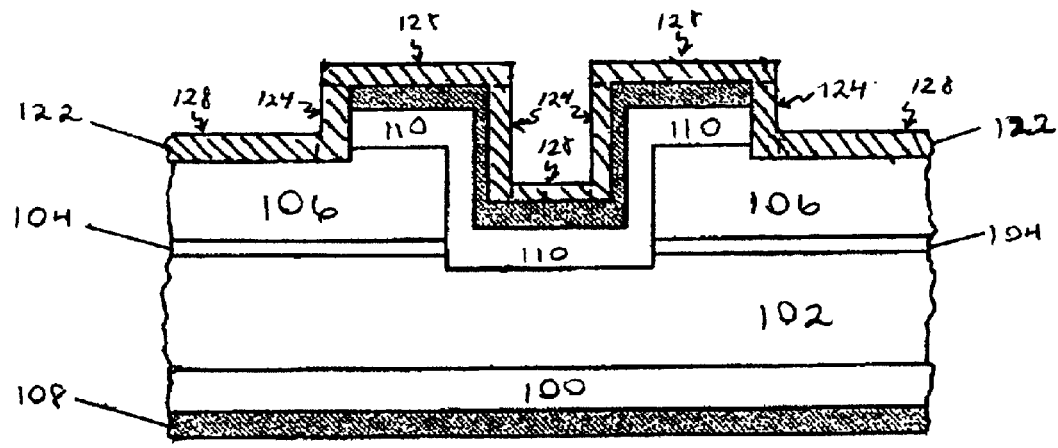

FIG. 7D shows a first step in a method of forming self-aligned emitter contacts on the substrate of FIG. 7C. In FIG. 7D, an insulating layer 122 is formed on the exposed surfaces of the substrate. Insulating layer 122 is preferably a silicon dioxide layer. The insulating layer can be formed by any known deposition process (e.g., CVD or PECVD). As shown in FIG. 7C, insulating layer 122 comprises horizontal portions 128 and vertical portions 124.

Figure 7E:
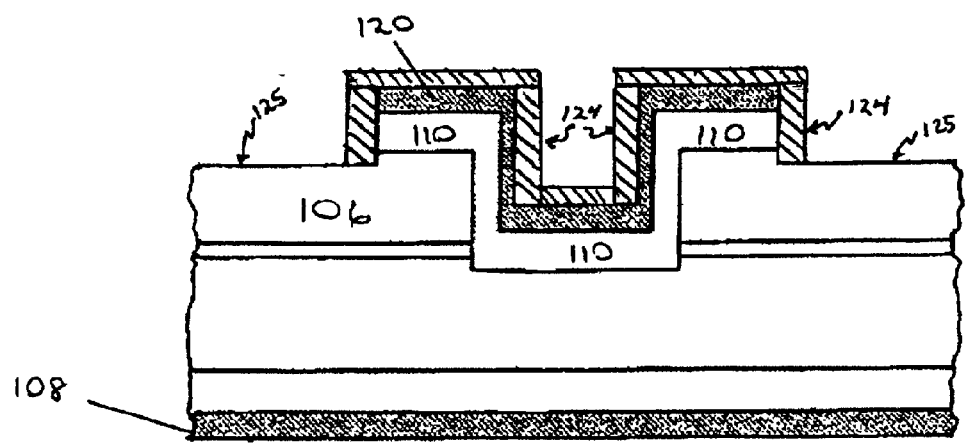

FIG. 7E shows a second step in a method of forming self-aligned emitter contacts. As shown in FIG. 7E, an etching process has been used to selectively remove portions of insulating layer 122 from surfaces 125 of emitter contact regions 106. Selective removal can be accomplished using photolithography techniques. As a result, portions of insulating layer 122 remain on the side walls of emitter contact openings 107.

Figure 7F:
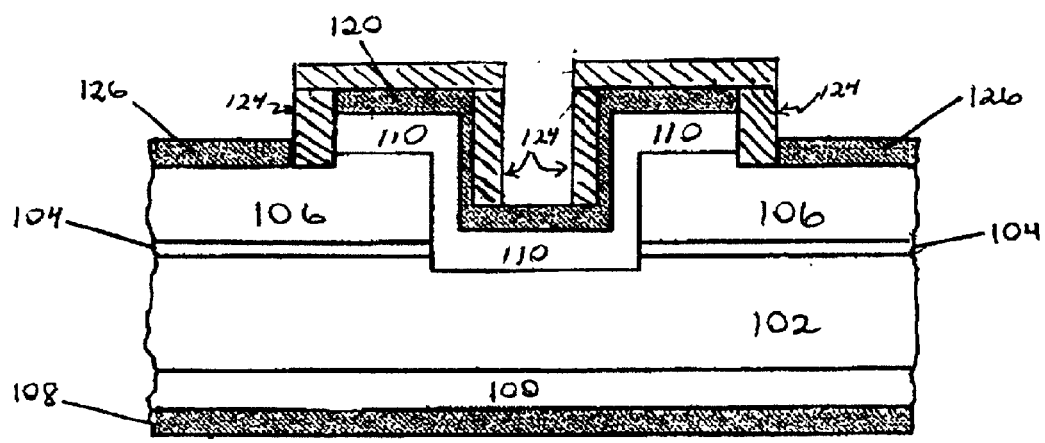

FIG. 7F shows a third step in a method of forming self-aligned emitter contacts. As shown in FIG. 7F, emitter contacts 126 have been deposited on exposed surfaces of emitter layer 106 in the emitter contact openings. As can be seen from FIG. 7F, emitter contacts 126 are spaced from sidewalls of the emitter contact openings by insulating material from insulating layer 122. The methods illustrated in FIGS. 6 and 7 are merely exemplary of methods that can be used to manufacture SiC BJTs according to the invention. Other known semiconductor manufacturing techniques can also be used according to the invention.

From the foregoing, it will be appreciated that, although specific embodiments of the invention have been described herein for purposes of illustration, various modifications may be made without deviating from the spirit and scope of the invention.

What is claimed is:

1. A method of making a SiC bipolar junction transistor comprising:

providing a collector comprising SiC doped with a donor material, the collector having first and second major surfaces;

optionally forming a drift layer on the first major surface of the collector, the drift layer comprising SiC doped with a donor material;

forming a first base layer on the first major surface of the collector or on the drift layer, the first base layer comprising SiC doped with an acceptor material;

forming an emitter layer on the first base layer, the emitter layer comprising SiC doped with a donor material;

etching through the emitter layer and the first base layer to expose the collector or drift layer and to form at least one raised emitter region having an upper surface defined by regions of etched emitter and first base layer, the etched regions comprising bottom and sidewall surfaces;

forming a second base layer comprising SiC doped with an acceptor material, wherein the second base layer covers the bottom and sidewall surfaces of the etched regions and the upper surfaces of emitter regions;

forming emitter contact openings through the second base layer on upper surfaces of the emitter regions to expose emitter material, the emitter contact openings having bottom and sidewall surfaces;

forming base contacts on surfaces of the second base material in the etched regions; and forming emitter contacts on surfaces of the emitter material in the emitter contact openings.

2. The method of claim 1, wherein the step of forming the drift layer comprises epitaxially growing the drift layer on an exposed surface of the collector and wherein the step of forming the first base layer comprises epitaxially growing the first base layer on an exposed surface of the drift layer.

3. The method of claim 1, wherein the collector layer is doped with a donor material at a first doping level and the drift layer is doped with a donor material at a second doping level and wherein the first doping level is higher than the second doping level.

4. The method of claim 3, wherein the first doping level is $10^{18}$ atoms·cm$^{-3}$ or greater and the second doping level is $10^{15}$ atoms·cm$^{31\ 3}$ or less.

5. The method of claim 2, wherein the step of forming the emitter layer comprises epitaxially growing the emitter layer on the first base layer.

6. The method of claim 5, wherein the emitter layer is doped with a donor material during epitaxial growth.

7. The method of claim 6, wherein the emitter layer is doped at a doping level of $10^{18}$ atoms·cm$^{-3}$ or greater during epitaxial growth.

8. The method of claim 5, wherein the step of forming the second base layer comprises epitaxially growing the second base layer on an exposed surface of the emitter layer.

9. The method of claim 8, wherein the second base layer is doped with an acceptor material during epitaxial growth.

10. The method of claim 9, wherein the second base layer is doped at a doping level of $10^{18}$ atoms·cm$^{-3}$ or greater during epitaxial growth.

11. The method of claim 1, further comprising:

forming a plurality of raised guard rings in the overgrown base layer, the raised guard rings circumscribing the raised emitter regions.

12. The method of claim 11, wherein the guard rings are formed simultaneously with the formation of the emitter contact openings.

13. A method of making a SiC bipolar junction transistor comprising:

providing a collector comprising SiC doped with a donor material, the collector having first and second major surfaces;

optionally forming a drift layer on the first major surface of the collector, the drift layer comprising SiC doped with an donor material;

forming a first base layer on the first major surface of the collector or on the drift layer, the first base layer comprising SiC doped with an acceptor material;

forming an emitter layer on the first base layer, the emitter layer comprising SiC doped with a donor material;

etching through the emitter layer and the first base layer to expose the collector or drift layer and to form at least one raised emitter region defined by regions of etched emitter and first base layer, the etched regions comprising bottom and sidewall surfaces;

forming a second base layer comprising SiC doped with an acceptor dopant, wherein the second base layer covers the bottom and sidewall surfaces of the etched regions;

forming a base contact layer on the second base layer;

forming emitter contact openings through the base contact layer on surfaces of the raised emitter regions to expose the second base layer, etching emitter contact openings through the second base layer on surfaces of the raised emitter regions using the base contact layer as a mask to expose emitter material;

forming emitter contacts on the emitter material in the emitter contact openings.

14. The method of claim 13, wherein:

the step of forming the drift layer comprises epitaxially growing the drift layer on the first major surface of the collector;

the step of forming the first base layer comprises epitaxially growing the first base layer on the drift layer or on the first major surface of the collector;

the step of forming the emitter layer comprises epitaxially growing the emitter layer on an exposed surface of the first base layer; and the step of forming the second base layer comprises epitaxially growing the second base layer on an exposed surface of the emitter layer;

wherein dopant materials are incorporated into each of the layers during growth.

15. The method of claim 13, wherein the collector is doped with a donor material at a first doping level and the drift layer is doped with a donor material at a second doping level.

16. The method of claim 15, wherein the first doping level is $10^{18}$ atoms·cm$^{-3}$ or greater and the second doping level is $10^{15}$ atoms·cm$^{-3}$ or less.

17. The method of claim 14, wherein the emitter layer is doped at a doping level of $10^{18}$ atoms·cm$^{-3}$ or greater during epitaxial growth.

18. The method of claim 14, wherein the second base layer is doped at a doping level of $10^{18}$ atoms·cm$^{-3}$ or greater during epitaxial growth.

19. The method of claim 14, further comprising:

forming a plurality of raised guard rings in the base contact layer, the raised guard rings circumscribing the one or more raised emitter regions and etched regions; and etching a plurality of raised guard rings in the second base layer using the base contact layer as a mask.

20. The method of claim 19, wherein the guard rings and emitter contact openings are formed simultaneously in the base contact layer and/or etched simultaneously in the second base layer.

* * * * *